US008404366B2

(12) United States Patent
Ahn et al.

(10) Patent No.: US 8,404,366 B2
(45) Date of Patent: Mar. 26, 2013

(54) SURFACE TREATING METHOD FOR CUTTING TOOLS

(75) Inventors: Dong Gil Ahn, Daegu (KR); Joo Wan Lee, Daegu (KR)

(73) Assignee: TaeguTec, Ltd., Daegu (KR)

( * ) Notice: Subject to any disclaimer, the term of this patent is extended or adjusted under 35 U.S.C. 154(b) by 344 days.

(21) Appl. No.: 12/521,929

(22) PCT Filed: Jan. 2, 2007

(86) PCT No.: PCT/KR2007/000007
§ 371 (c)(1),
(2), (4) Date: Jul. 1, 2009

(87) PCT Pub. No.: WO2008/082020
PCT Pub. Date: Jul. 10, 2008

(65) Prior Publication Data
US 2009/0317199 A1    Dec. 24, 2009

(51) Int. Cl.
*B32B 9/00*    (2006.01)
(52) U.S. Cl. ............ 428/701; 51/307; 51/309; 427/331; 427/375; 427/376.1; 427/376.2; 427/419.1; 427/419.2; 427/419.7; 428/216; 428/336; 428/698; 428/702
(58) Field of Classification Search .................... 51/307, 51/309; 428/216, 336, 698, 701, 702; 427/331, 427/375, 376.1, 376.2, 419.1, 419.2, 419.7
See application file for complete search history.

(56) References Cited

U.S. PATENT DOCUMENTS

| | | | |
|---|---|---|---|
| 5,516,588 A * | 5/1996 | van den Berg et al. | 428/700 |
| 6,210,726 B1 | 4/2001 | Schiller et al. | |
| 6,623,876 B1 | 9/2003 | Caron | |
| 7,241,492 B2 * | 7/2007 | Kohara et al. | 428/336 |
| 7,531,212 B2 * | 5/2009 | Kohara et al. | 427/376.6 |
| 7,763,346 B2 * | 7/2010 | Osada et al. | 51/307 |
| 7,776,393 B2 * | 8/2010 | Tamagaki et al. | 427/299 |
| 7,838,083 B1 * | 11/2010 | Youchison et al. | 427/597 |
| 2004/0224159 A1 | 11/2004 | Oshika et al. | |
| 2004/0224160 A1 | 11/2004 | Ueda et al. | |

FOREIGN PATENT DOCUMENTS

| | | |
|---|---|---|
| CN | 1542166 | 11/2004 |
| JP | 10-140353 | * 5/1998 |
| JP | 10-212581 A | 8/1998 |
| JP | 2004-284003 A | 10/2004 |

(Continued)

OTHER PUBLICATIONS

Kyrylov et al "Effect on ion irradiation during deposition on the structure of alumina thin films grown by plasma assisted chemical vapour deposition" Appl. Phys. A, vol. 80, 2005, pp. 1657-1660.*

(Continued)

*Primary Examiner* — Archene Turner
(74) *Attorney, Agent, or Firm* — Womble Carlyle (57) ABSTRACT

In a cutting tool, if the outermost ceramic coating layer is a $\kappa\text{-}Al_2O_3$ coating layer, then certain microns of the $\kappa\text{-}Al_2O_3$ layer will be transformed into an $\alpha\text{-}Al_2O_3$ by instantaneous melting, vaporization and solidification. Further, if the outermost coating layer of the ceramic coating layers is an $\alpha\text{-}Al_2O_3$ coating layer, then the surface roughness will be enhanced since at least a portion of it will be melted, wherein the melted surface will be solidified with its surface flattened by the surface tension provided in a melted state.

20 Claims, 4 Drawing Sheets

FOREIGN PATENT DOCUMENTS

| JP | 2006-315149 | * | 11/2006 |
|---|---|---|---|
| RU | 2 092 611 | | 10/1997 |
| RU | 2194798 | | 12/2002 |
| WO | 95/19457 | | 7/1995 |
| WO | WO 00/52225 | | 9/2000 |

OTHER PUBLICATIONS

English translation of CN 1542166.*

English translation of RU 2092611.*

Russian Office Action in Application No. 2009129527/02, dated Sep. 23, 2010.

Decision on Grant in Russian application No. 2009129527/02, filed Jan. 2, 2007.

Extended European Search Report dated Apr. 13, 2011 issued in corresponding EP Application No. 07700799.5.

Larsson et al, "Microstructural investigation of heat-treated CVD κ-$Al_2O_3$ multilayer coatings", *International Journal of Refractory Metals and Hard Materials*, vol. 16, No. 4-6, Jan. 1, 1998, pp. 369-376.

Lindulf et al, "Microstructural investigation of the κ-$Al_2O_3$ → α-$Al_2O_3$ transformation in multilayer coatings of chemically vapour deposited κ-$Al_2O_3$", *Thin Solid Films*, vol. 253, No. 1-2, Dec. 15, 1994, pp. 311-317.

Perry et al, "Rapid Thermal Processing of Tin Coatings Deposited by Chemical and Physical Vapor Deposition Using a Low-Energy, High-Current Electron Beam: Micrstructural Studies and Properties", *Metallurgical and Materials Transactions A* vol. 30A, No. 11, Nov. 1, 1999, pp. 2931-2939.

Vuorinen et al, "Phase transformation in chemically vapour-deposited κ-alumina", *Thin Solid Films*, vol. 214, No. 2, Jul. 15, 1992, pp. 132-143.

Chinese Office Action in application No. 200780049084.6, dated Jun. 25, 2010.

International Search Report in PCT/KR2007/000007; dated Sep. 28, 2007.

Written Opinion in PCT/KR2007/000007; dated Sep. 28, 2007.

Official Action dated Feb. 17, 2012 issued in European counterpart application No. 07700799.5.

Pogrebnjak, A.D. et al "TiN/Cr/$Al_2O_3$ and Tin/$Al_2O_3$ hybrid coatings structure features and properties resulting from combined treatment", *Surface & Coatings Technology* 201 (2006) 2621-2632.

* cited by examiner

SURFACE TREATING METHOD FOR CUTTING TOOLS

TECHNICAL FIELD

The present invention generally relates to a method of treating a surface of a cutting tool, and more particularly to a surface treatment method for a ceramic coating layer of a coated cutting tool through an electron beam.

BACKGROUND ART

Ceramic is widely used as a coating material for hard metal cutting tools since its mechanical properties do not easily deteriorate even at high temperatures. Although there are various ceramic coating materials, Alumina ($Al_2O_3$) is particularly well known for its excellent thermal stability, hardness and abrasion resistance among such materials.

Out of various phases of Alumina, $\alpha$-$Al_2O_3$ has excellent thermal resistance and abrasion resistance. Thus, it is preferable to form an $\alpha$-$Al_2O_3$ coating layer on a surface of a cutting tool. However, compared to the formation of a $\kappa$-$Al_2O_3$ coating layer, it is more difficult to form an $\alpha$-$Al_2O_3$ coating layer on a surface of a cutting tool. Further, an $\alpha$-$Al_2O_3$ coating layer is allowed to form only after a certain coating material such as TiCNO is formed on the substrate of a cutting tool. Transforming the phase of the $\kappa$-$Al_2O_3$ coating layer, which is molded on the surface of a cutting tool, into an $\alpha$ phase was considered. However, it is difficult to realize this since such a transformation requires initially forming a $\kappa$-$Al_2O_3$ coating layer on the surface of a cutting tool, melting the cutting tool at a temperature of more than 2000° C. and then instantaneously cooling the cutting tool. Also, the cutting tool melted at a temperature of more than 2000 degrees Celsius can be suddenly cooled. Thus, the K phase has been traditionally used as an alumina coating layer.

A cutting tool with bad surface roughness tends to have a high cutting resistance and easily adheres to a workpiece. Thus, the service life is shortened. A ceramic coating such as $\alpha$-$Al_2O_3$ has bad surface roughness compared to other coating materials for a cutting tool. Thus, such a ceramic coating needs to be surface-treated to obtain an improved surface roughness. Various methods such as blasting, polishing, brushing, etc., are known as a surface treating method for improving surface roughness.

However, a ceramic coating material such as $\alpha$-$Al_2O_3$ is very difficult to surface-treat in the above-mentioned methods due to its hardness. Thus, it takes much time and effort to perform such surface treating operations. Furthermore, it has limits on the improvement of surface roughness.

SUMMARY OF THE INVENTION

The present invention is conceived in order to solve the above problems. It is an object of the present invention to provide a simple and reliable method of forming an $\alpha$-$Al_2O_3$ coating layer on a surface of a cutting tool.

It is another object of the present invention to provide a simple and reliable method for dramatically enhancing the surface roughness of an $\alpha$-$Al_2O_3$ ceramic coating layer formed on a cutting tool.

Furthermore, the present invention seeks to provide a cutting tool with an improved $\alpha$-$Al_2O_3$ coating layer on its surface.

In order to achieve the above objects and other objects, a surface treating method according to the present invention comprises the steps of: providing one or more ceramic coating layers on a surface of a cutting tool; and instantaneously melting at least a portion of the outermost coating layer of the ceramic coating layers by irradiating an electron beam to the ceramic coating layers.

The outermost coating layer of the one or more ceramic coating layers may be a $\kappa$-$Al_2O_3$ coating layer or a TiN coating layer disposed on a $\kappa$-$Al_2O_3$ coating layer. A portion of the $\kappa$-$Al_2O_3$ coating layer is instantaneously melted by the irradiation of an electron beam and then transformed into $\alpha$-$Al_2O_3$ while it is solidified. Furthermore, the TiN coating layer is evaporated by the irradiation of the electron beam. At least a portion of the $\kappa$-$Al_2O_3$ coating layer, which was below the TiN coating layer, is instantaneously melted and transformed into $\alpha$-$Al_2O_3$.

Further, the outermost coating layer of one or more ceramic coating layers may be an $\alpha$-$Al_2O_3$ coating layer or a TiN coating layer disposed on an $\alpha$-$Al_2O_3$ coating layer. The $\alpha$-$Al_2O_3$ ceramic coating layer is solidified with its surface flattened by surface tension caused while at least a portion of the $\alpha$-$Al_2O_3$ ceramic coating layer has been melted by the irradiation of the electron beam. As a result, its surface roughness may be enhanced predominantly. The TiN coating layer is evaporated by the irradiation of the electron beam and at least a portion of the $\alpha$-$Al_2O_3$ coating layer, which was below the TiN coating layer, is melted. As such, the $\alpha$-$Al_2O_3$ ceramic coating layer is solidified with its surface flattened by the surface tension. Thus, an excellent improvement in surface roughness can be expected.

DETAILED DESCRIPTION

A surface treating method using electron beam irradiation according to the present invention will now be described with reference to the accompanying drawings.

The present inventors have studied technologies, which can effectively surface-treat an alumina coating layer of a cutting tool. Further, they have studied technologies, which can transform a $\kappa$-$Al_2O_3$ coating layer into an $\alpha$-$Al_2O_3$ coating layer in a simple and stable manner, without damaging the substrate of a cutting tool and other coating layers thereon.

Attempts were made to increase the stiffness of a metallic cutting tool or a surface of a metallic coating layer by irradiating thermal energy such as a laser on the surfaces. This is to diffuse certain elements composing such a metallic material to the surface. However, the attempt for thermally controlling a surface roughness of a ceramic coating layer, which is thermally very stable, has not yet been made. The present inventors have studied regarding thermally controlling a surface state of the ceramic coating layer.

For example, the present inventors have studied regarding controlling a surface roughness of the ceramic coating layer of a cutting tool using a laser beam. However, they found this method to be extremely improper. That is, when CO or YAG laser beam, which has strong energy and which is difficult to control, is irradiated to a surface of a coated cutting insert, both ceramic coating layer and substrate are affected by the laser beam melting and deforming the cutting tool. In addition, since the laser beam having a small irradiation area irradiates its energy on relatively broader surface of the cutting tool, scanning the surface of the cutting tool takes too much time. Further, such surface treatment fails to uniformly treat the surface of an object being treated, thus leaving windings on the surface. Consequently, such surface treatment is not suitable for use with a cutting insert.

On the contrary, unlike the laser beam, an electron beam is capable of irradiating large areas since the irradiation area of the electron beam is not limited to small irradiation areas. Accordingly, the electron beam may reduce a time required for surface treatment and can provide uniform surface treatment over entire surface of the object being treated. Further, the electron beam can be controlled such that only a portion of an outermost coating layer of a cutting tool is transformed without damaging substrate or any other coating layers of a cutting tool.

Figure 1:
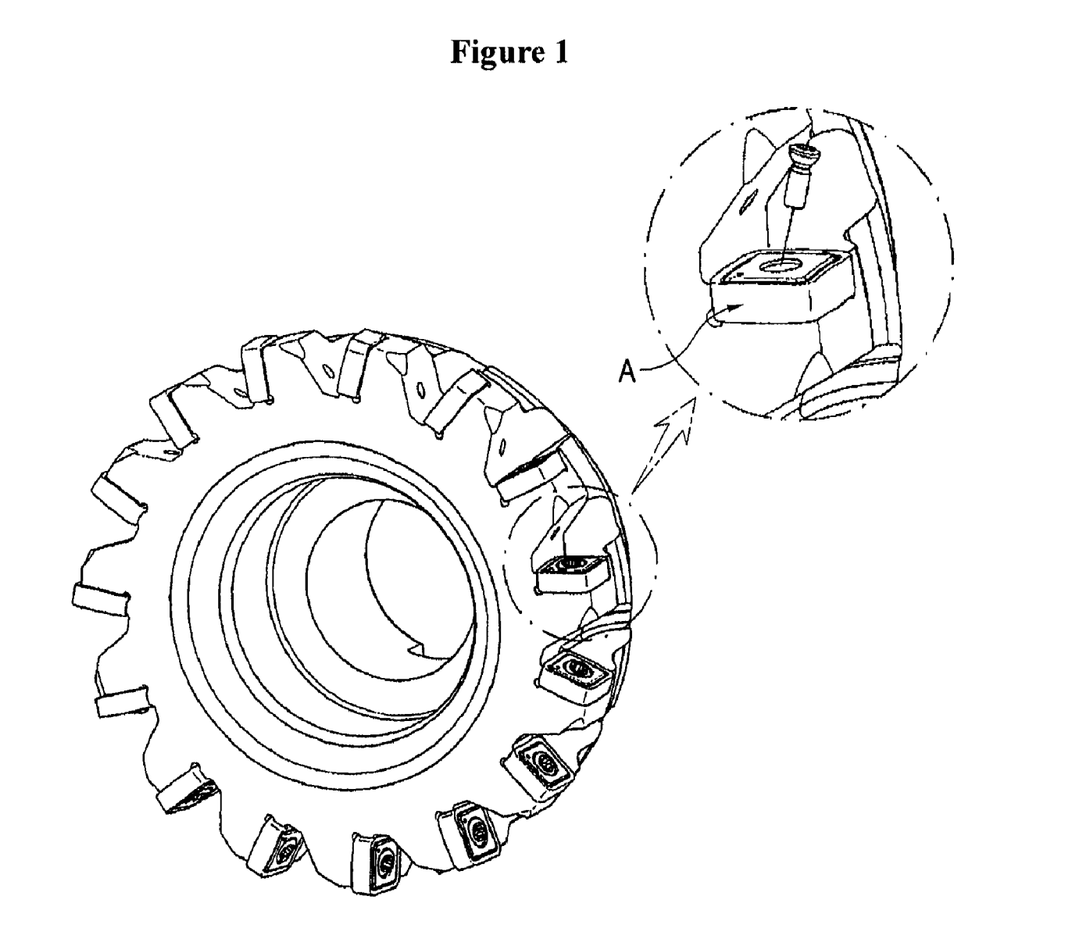
FIG. 1 is a perspective view of a conventional milling cutter with a cutting insert.

FIG. 1 is a perspective view of a milling cutter with a cutting insert. A ceramic coating layer is formed on the surface of the cutting insert. The ceramic coating layer is coated on the surface of the insert with a certain thickness using known methods such as CVD, PVD and the like.

Figure 2:
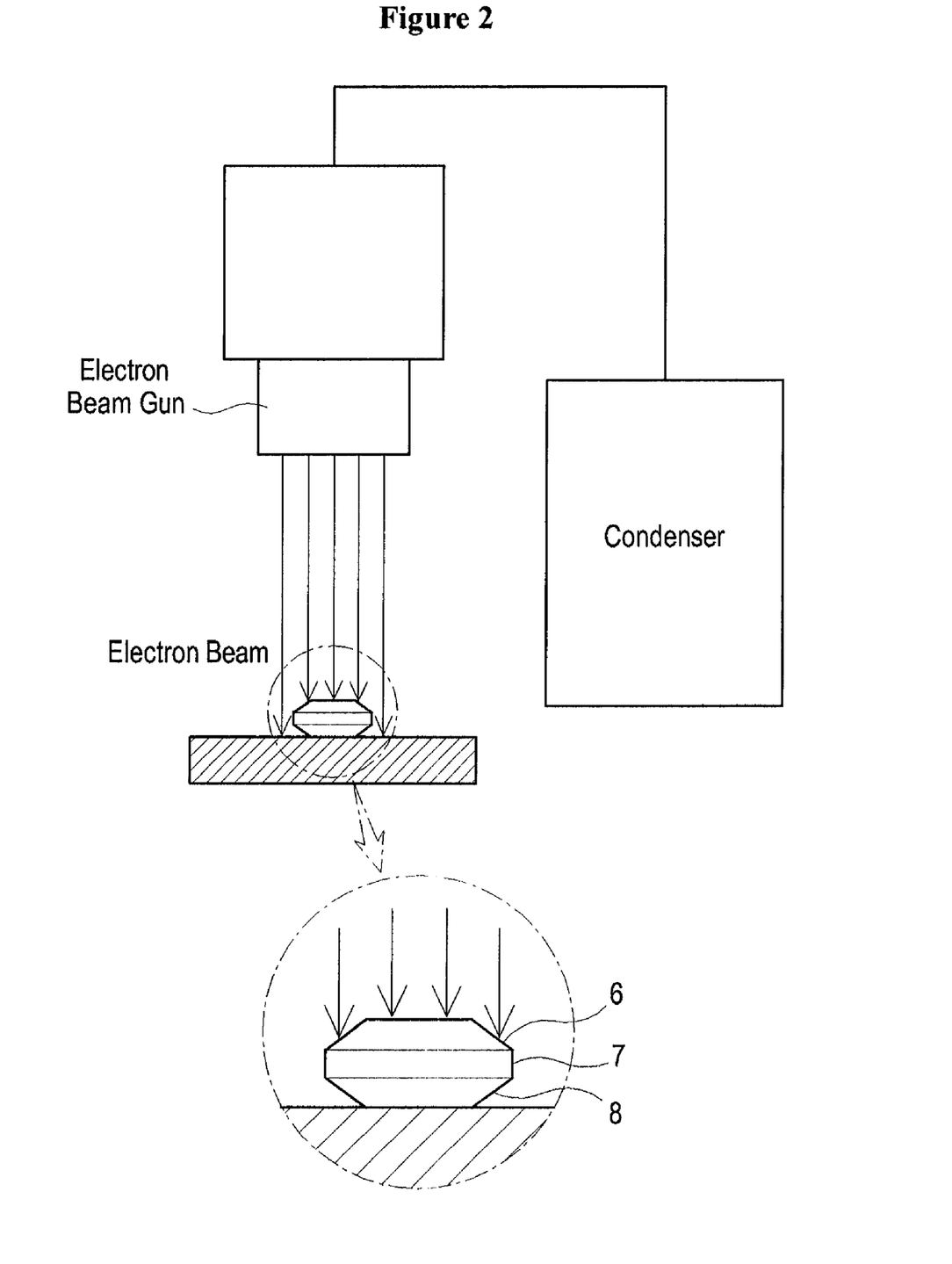
FIG. 2 is a diagram of a surface-treating process in accordance with one embodiment of the present invention.

FIG. 2 illustrates an example of a device for carrying out an electron beam surface treating process according to the present invention. An electron beam generating device is used in the electron beam surface treatment and comprises a condenser for an electron beam source, a controlling portion, an electron beam gun, etc. In the electron beam surface treatment, a ceramic-coated cutting insert is first placed inside the electron beam generating device. Then, the interior of the electron beam generating device is placed under a vacuum atmosphere and an appropriate amount of Argon gas or Nitrogen gas is injected therein to maintain the interior at 0.05 Pa vacuum level. Thereafter, an electron beam having a diameter of 50 mm to 100 mm is generated in a Cathode voltage range of 25-34KV. The electron beam shot from the electron beam gun is accelerated in the form of a thermal electron, which is discharged for a short time (theoretically about 1 over 5 hundred thousand seconds) on the ceramic coating layer of the cutting tool. Depending on the surface reaction state of the ceramic coating layer, the electron beam may be irradiated repeatedly for about 1-10 times.

The thermal electron, which collided onto the surface of the cutting tool, generates high heat instantaneously since the kinetic energy of the accelerated electron is transformed into a thermal energy. The temperature of the outermost coating layer of the ceramic coating layers at this moment can rise up to about 4000° C. The outermost ceramic coating layer is instantaneously melted from the surface to at least a certain depth (1~5 μm). If the outermost ceramic coating layer is a κ-$Al_2O_3$ coating layer, then a certain amount depth (μm) of the coating layer is transformed into an α-$Al_2O_3$ layer through instant melting and solidification of the κ-$Al_2O_3$. Furthermore, if the outermost coating layer is a TiN coating layer deposited on the κ-$Al_2O_3$, then the TiN coating layer is evaporated by the electron beam irradiation. Also, a portion of the adjacent κ-$Al_2O_3$ coating layer is transformed into α-$Al_2O_3$ by instantaneous melting and solidification. Preferably, the one or more ceramic coating layers may be multiple layers of Ti-carbonitride formed on the substrate of the cutting tool and a κ-$Al_2O_3$ coating layer formed on the multiple layers of Ti-carbonitride. Alternatively, they may be multiple layers of Ti-carbonitride formed on the substrate of the cutting tool and a κ-$Al_2O_3$/TiN coating layer formed on the multiple layers of Ti-carbonitride. Moreover, it is preferred that the one or more ceramic coating layers have a laminated order of TiN/MTCN/TiCN/κ-$Al_2O_3$ or TiN/MTCN/TiCN/κ-$Al_2O_3$/TiN from the substrate of the cutting tool. The κ-$Al_2O_3$ coating layer has a thickness of about 2 μm to 12 μm and a thickness of at least 1 μm to 4 μm of κ-$Al_2O_3$ is transformed into an α-$Al_2O_3$ coating layer through the electron beam irradiation. Further, if the outermost coating layer of the ceramic coating layers is a α-$Al_2O_3$ coating layer, then the surface roughness will be enhanced since its surface is solidified and then flattened by surface tension caused while a certain amount of thickness (μm) of the α-$Al_2O_3$ ceramic coating layer is melted. Alternatively, if the outermost coating layer is a TiN coating layer deposited on the α-$Al_2O_3$, then the surface roughness is enhanced since the outermost TiN coating layer is evaporated by the electron beam irradiation and at least a portion of the α-$Al_2O_3$ coating layer therebelow is solidified and flattened by surface tension caused while a certain amount of thickness (μm) of the α-$Al_2O_3$ ceramic coating layer is melted instantaneously after the outermost TiN coating layer is vaporized. Preferably, the one or more ceramic coating layers may be multiple layers of Ti-carbonitride formed on the substrate of the cutting tool and a TiCNO/α-$Al_2O_3$ coating layer formed on the multiple layers of Ti-carbonitride. Alternatively, they may be multiple layers of Ti-carbonitride formed on the substrate of the cutting tool and a TICNO/α-$Al_2O_3$/TiN coating layer formed on the multiple layers of Ti-carbonitride. Furthermore, the one or more ceramic coating layer may be multiple layers of Ti-carbonitride formed on the substrate of the cutting tool and a TiCO/α-$Al_2O_3$ coating layer formed on the multiple layers of Ti-carbonitride. Alternatively, they may be multiple layers of Ti-carbonitride formed on the substrate of the cutting tool and a TICO/α-$Al_2O_3$/TiN coating layer formed on the multiple layers of Ti-carbonitride. Moreover, it is preferred that the one or more ceramic coating layers have a laminated order of the one or more ceramic coating layers may be TiN/MTCN/TiCN/TiCNO/α-$Al_2O_3$ or TiN/MTCN/TiCN/TiCNO/α-$Al_2O_3$/TiN from the substrate of the cutting tool. Also, it is preferred that the one or more ceramic coating layers has a laminated order of the one or more ceramic coating layers may be TiN/MTCN/TiCN/TiCO/α-$Al_2O_3$ or TiN/MTCN/TiCN/TiCO/α-$Al_2O_3$/TiN from the substrate of the cutting tool.

Figure 3:
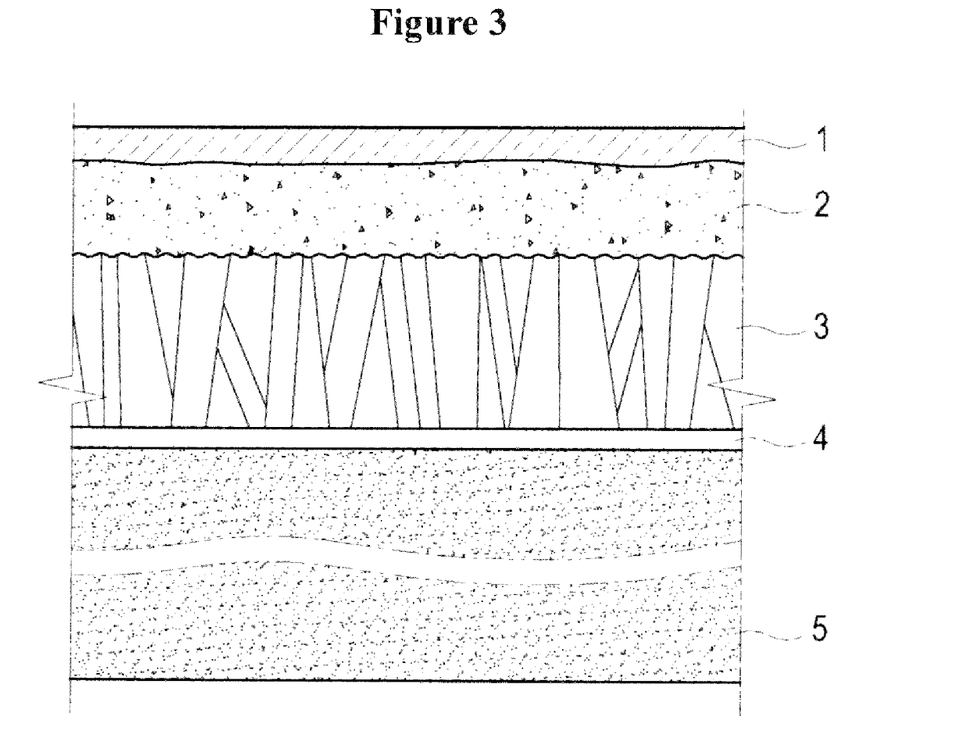
FIG. 3 is a cross-sectional view showing ceramic coating layers of a cutting insert after surface-treating through an electron beam.

FIG. 3 is a cross-sectional view showing ceramic coating layers of a cutting insert. In accordance with present invention, an electron beam is irradiated to ceramic coating layers (1 to 4) and a portion of an outermost κ-$Al_2O_3$ coating layer (2) is transformed into an α-$Al_2O_3$ layer (1). Alternatively, if the outermost coating layer is TiN, then the TiN layer will be evaporated by heat and at least an outer portion κ-$Al_2O_3$ coating layer will be transformed into an α-$Al_2O_3$ layer 1. Since the electron beam is irradiated for an extremely short time and reacts only a certain depth (μm) of the coating layer surface, the other coating layers (3 and 4) below the κ-$Al_2O_3$ coating layer or the cutting tool body (5) are not influenced by the electron beam.

Figure 4:
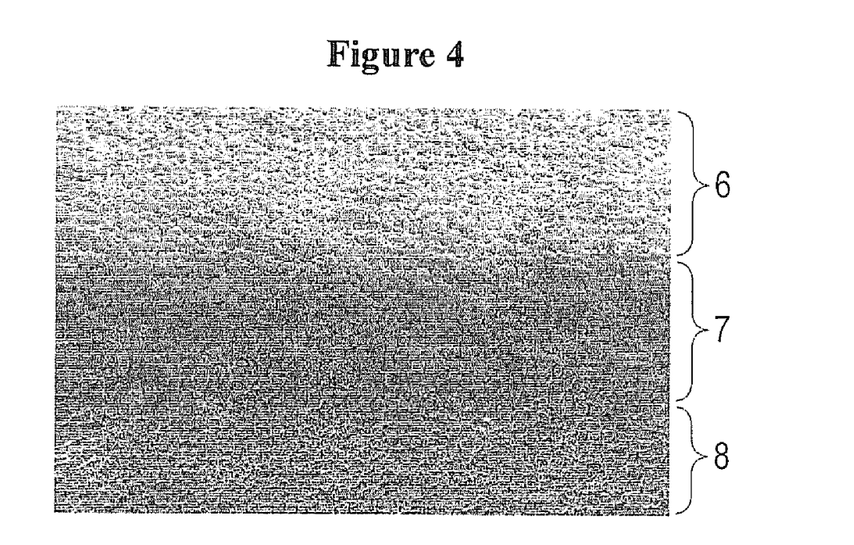
FIG. 4 is an enlarged photograph of a cutting insert coated with a $\kappa$-$Al_2O_3$ coating layer.
Figure 5:
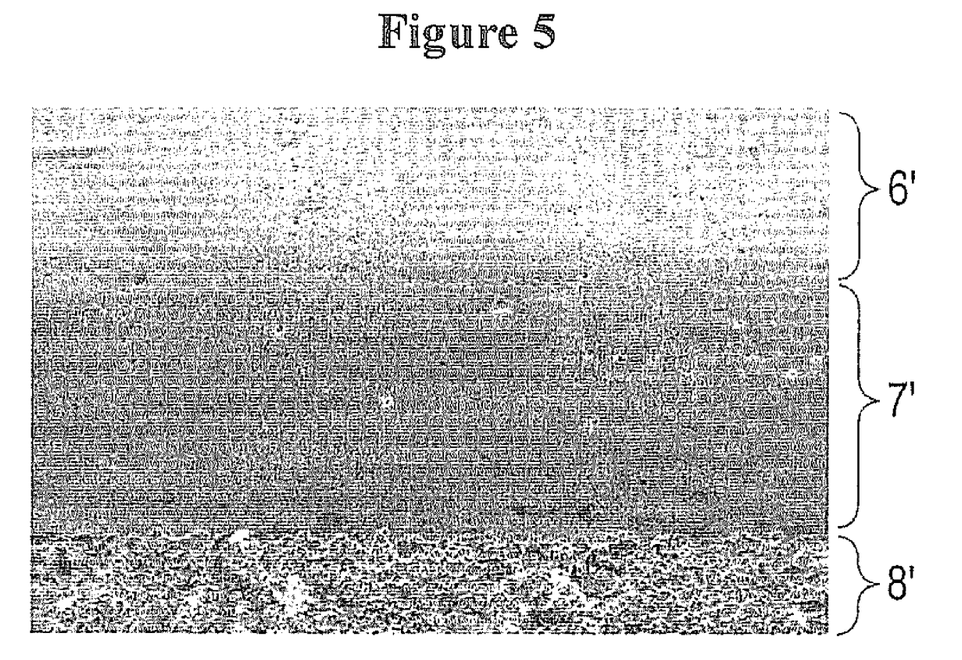
FIG. 5 is an enlarged photograph of the cutting insert of FIG. 3, which is taken after surface-treating through an electron beam.

Moreover, the surface roughness of the coating layer of the cutting tool is predominantly enhanced to under Ra 0.15 μm since the melted ceramic coating layer is re-solidified while the surface is flat due to surface tension. FIGS. 4 and 5 are photographs of the cutting insert of FIG. 3 magnified 500 times by the Scanning Electron Microscope (SEM), which is taken before and after the surface-treatment through an electron beam. FIG. 4 is a photograph showing a portion of a top rake surface (6), a cutting edge portion (7) and a flank face (8) of a κ-Al₂O₃ coated cutting insert before an electron beam is discharged. FIG. 5 shows that the κ-Al₂O₃ coating layers formed on the top rake surface (6) and the cutting edge portion (7) is transformed into α-Al₂O₃ coating layers (6' and 7') after the electron beam irradiation. Referring to FIGS. 4 and 5, it is confirmed that the surface roughness of the portions (6' and 7'), which are transformed into α-Al₂O₃, is predominantly enhanced compared to that of the portions (6 and 7) which have not been transformed.

Hereinafter, the test examples of the cutting tools, which were surface treated with an electron beam in accordance with the present invention, will be described.

[TEST 1]

The present inventor made a cutting performance test of cutting tools, which were treated with an electron beam in accordance of the present invention, as described below.

The tool life of each cutting tool was measured, wherein the tool life is the time spent for a wear amount of a cutting flank face of the cutting tool to reach 0.25 mm. If a breakage or chipping of the cutting blade has occurred during cutting, then the tool life is determined as the time spent until the breakage or chipping.

Cutting inserts A and B are used in the cutting performance tests, wherein the cutting insert A is a CNMG120412 turning insert according to the ISO standard and is CVD coated with TiN/MTCN/TiCN/κ-Al₂O₃ coating layer, and wherein the cutting insert B is the same turning insert according to the ISO standard as the cutting insert A and is CVD coated with TiN/MTCN/TiCN/κ-Al₂O₃/TiN coating layer. Tests were performed on cutting inserts A and B with their surface treated by the electron beam and without surface treatments by the electron beam, respectively.

The turning inserts surface treated with the electron beam showed a transformation wherein about 1.5 μm of the κ-Al₂O₃ coating layer was transformed into an α phase. Furthermore, when the outermost coating layer was TiN, the TiN coating layer was evaporated and about 1.5 μm of the κ-Al₂O₃ coating layer therebelow was transformed into an α phase.

The cutting conditions were as follows: cutting speed (v)=400 rpm; feed rate (f)=0.25 mm/rev; and depth of cut (d)=2.0 mm. Furthermore, each cutting insert was tested to cut a gray cast iron having a size 90×90×200 mm. Test results are shown in [Table, 1] below.

TABLE 1

| CVD coated cutting insert | coating layer | | | cutting result | |
|---|---|---|---|---|---|
| | before electron beam surface treatment | electron beam surface treatment | dry/wet | tool-life (minute) | remark |
| cutting insert A | TiN/MTCN/TiCN/ κ-Al₂O₃ | with without | dry | 18 12 | — breakage |
| cutting insert B | TiN/MTCN/TiCN/ κ-Al₂O₃/TiN | with without | wet | 62 48 | — chipping | insert: CNMG120412
work material: gray cast iron (HB190)
cutting condition: v = 400 rpm, f = 0.25 mm/rev, d = 2.0

As can be seen from [Table 1], the tool lives of the cutting inserts A and B, the surfaces of which were not treated by the electron beam, ended by breakage or chipping before the wear amount of the cutting flank face reached 0.25 mm. On the other hand, the cutting inserts A and B, the surfaces of which were treated by the electron beam, did not show any breakage or chipping before their wear amount reached 0.25 mm and their tool lives lasted even after breakage or chipping started to form.

[TEST 2]

Cutting inserts A and B were used for the test, wherein the cutting insert A is a CNMG120412 turning insert according to the ISO standard and is CVD coated with TiN/MTCN/TiCN/κ-Al₂O₃ coating layer, and wherein the cutting insert B is the same turning insert as cutting insert A according to the ISO standard and is CVD coated with TiN/MTCN/TiCN/κ-Al₂O₃/TiN coating layer. The workpiece of the test was carbon steel and the other test conditions were the same as [TEST 1]. Test results are shown in [Table 2] below.

TABLE 2

| CVD coated cutting insert | coating layer | | | cutting result | |
|---|---|---|---|---|---|
| | before electron beam surface treatment | electron beam surface treatment | dry/wet | tool-life (minute) | remark |
| cutting insert A | TiN/MTCN/TiCN/ κ-Al₂O₃ | with without | dry | 22 18 | — — |
| cutting insert B | TiN/MTCN/TiCN/ κ-Al₂O₃/TiN | with without | wet | 37 32 | — chipping | insert: CNMG120412
work material: carbon steel (HB215)
cutting condition: v = 300 rpm, f = 0.25 mm/rev, d = 2.0

As can be seen from [Table 2], tool lives of the cutting inserts A and B, the surfaces of which were not treated by the electron beam, are longer than those of the cutting insert A and the cutting insert B whose surface was treated by the electron beam.

As can be seen from [Table 1] and [Table 2], the cutting tool, which is surface treated by the electron beam in accordance with the present invention, has an enhanced tool life compared to that of a cutting tool whose surface is not treated by the electron beam under the same cutting conditions. This is a result of the coating layer having a surface, which is minute and flat, due to the electron beam surface treatment.

Such a treatment reduces the cutting resistance between the workpiece as well as the adherence of the workpiece to the cutting tool.

While the present invention has been particularly shown and described with reference to exemplary embodiments thereof, it will be understood by those of ordinary skill in the art that various alternations or modifications can be made without departing from the scope of the present invention.

According to the surface treatment method with an electron beam of the present invention, when the outermost coating layer of a ceramic coating layer is a $\kappa$-$Al_2O_3$ coating layer, a certain thickness (microns) of the $\kappa$-$Al_2O_3$ coating layer surface will be melted, evaporated and solidified by the electron beam, and then be transformed into an $\alpha$-$Al_2O_3$. Furthermore, if a laminated order of the outermost coating layers of a ceramic coating layer are TiN and $\kappa$-$Al_2O_3$ consecutively, then the TiN layer will be evaporated by the electron beam and at least a portion of the outermost surface of the $\kappa$-$Al_2O_3$ coating layer will be transformed into an $\alpha$-$Al_2O_3$. In such a case, other coating layers below the $\kappa$-$Al_2O_3$ coating layer and the body of the cutting tool are not influenced by the electron beam. Thus, an $\alpha$-$Al_2O_3$ coating layer may be formed on a surface of a cutting tool in an easy and stable manner.

Furthermore, according to the surface treatment method with an electron beam of the present invention, when the outermost coating layer of a ceramic coating layer is an $\alpha$-$Al_2O_3$ coating layer, at least a portion of it will be melted. Then, the melted surface will be solidified with its surface flattened by the surface tension provided in the melted condition. Thus, the surface roughness of the coating layer can be improved predominantly. Further, if a laminated order of the outermost coating layer of a ceramic coating layer is TiN and $\alpha$-$Al_2O_3$ in turn, then the TiN layer will be evaporated by the electron beam and at least a portion of the outermost surface of the $\alpha$-$Al_2O_3$ coating layer will be melted, the melted surface thereof being solidified with its surface flattened by the surface tension provided in the melted condition. Thus, a surface roughness of the coating layer can be improved predominantly. As such, an $\alpha$-$Al_2O_3$ coating layer is formed on a surface of a cutting tool in an easy and stable manner. Moreover, an improved surface roughness reduces the cutting resistance and adherence with the workpiece, which provides the cutting tool with a significantly improved tool life.

The invention claimed is:

1. A method for treating an entire top rake surface of a hard metal cutting tool, comprising:
    providing one or more ceramic coating layers on the top rake surface of the hard metal cutting tool; and
    after the one or more ceramic coating layers are provided on the top rake surface, irradiating an electron beam to the ceramic coating layer on the entire top rake surface to instantaneously melt at least a portion of the outermost coating layer of the ceramic coating layer,
    wherein the outermost coating layer is an $\alpha$-$Al_2O_3$ coating layer or a TiN coating layer disposed on an $\alpha$-$Al_2O_3$ coating layer.

2. The method of claim 1, wherein if the outermost coating layer is a $\kappa$-$Al_2O_3$ coating layer, then at least a portion of the $\kappa$-$Al_2O_3$ coating layer is transformed into an $\alpha$-$Al_2O_3$.

3. The method of claim 1, wherein the ceramic coating layers are multiple layers of Ti-carbonitride formed on the substrate of the hard metal cutting tool and a TiCNO/$\alpha$-$Al_2O_3$ coating layer formed on the multiple layers of Ti-carbonitride, or are multiple layers of Ti-carbonitride formed on the substrate of the hard metal cutting tool and a TiCNO/$\alpha$-$Al_2O_3$/TiN coating layer formed on the multiple layers of Ti-carbonitride.

4. The method of claim 1, wherein the ceramic coating layers are multiple layers of Ti-carbonitride formed on the substrate of the hard metal cutting tool and a TiCO/$\alpha$-$Al_2O_3$ coating layer formed on the multiple layers of Ti-carbonitride, or are multiple layers of Ti-carbonitride formed on the substrate of the hard metal cutting tool and a TiCO/$\alpha$-$Al_2O_3$/TiN coating layer formed on the multiple layers of Ti-carbonitride.

5. The method of claim 1, wherein a laminated order of the ceramic coating layer is TiN/MTCN/TiCN/TiCNO/$\alpha$-$Al_2O_3$ or TiN/MTCN/TiCN/TiCNO/$\alpha$-$Al_2O_3$/TiN from the substrate of the hard metal cutting tool.

6. The method of claim 1, wherein a laminated order of the ceramic coating layer is TiN/MTCN/TiCN/TiCO/$\alpha$-$Al_2O_3$ or TiN/MTCN/TiCN/TiCO/$\alpha$-$Al_2O_3$/TiN from the substrate of the hard metal cutting tool.

7. The method of claim 1, wherein the outermost coating layer comprises $\alpha$-$Al_2O_3$ and wherein the $\alpha$-$Al_2O_3$ is solidified with its surface flattened by surface tension to thereby form an enhanced outermost coating layer.

8. The method of claim 1, wherein the outermost coating layer is a TiN coating layer disposed on an $\alpha$-$Al_2O_3$ coating layer, and
    wherein at least a portion of the TiN coating layer is evaporated by the irradiated electron beam.

9. The method of claim 8, wherein the $\alpha$-$Al_2O_3$ coating layer is solidified with its surface flattened by surface tension after the instantaneous melting to thereby form an enhanced outermost coating layer.

10. A method for treating an entire top rake surface of a hard metal cutting tool so as to leave an outermost $\alpha$-$Al_2O_3$ coating layer, comprising:
    providing one or more ceramic coating layers on the top rake surface of the hard metal cutting tool; and
    after the one or more ceramic coating layers are provided on the top rake surface, irradiating an electron beam to the ceramic coating layer on the entire top rake surface to instantaneously melt at least a portion of the outermost coating layer of the ceramic coating layer,
    wherein:
    the outermost coating layer is a TiN coating layer disposed on a $\kappa$-$Al_2O_3$ coating layer,
    at least a portion of the TiN coating layer is evaporated through the electron beam irradiation, and
    the $\kappa$-$Al_2O_3$ coating layer there below is transformed into $\alpha$-$Al_2O_3$.

11. The method of claim 10, wherein the ceramic coating layers are multiple layers of Ti-carbonitride formed on the substrate of the hard metal cutting tool and a $\kappa$-$Al_2O_3$/TiN coating layer formed on the multiple layers of Ti-carbonitride.

12. The method of claim 10, wherein a laminated order of the ceramic coating layer is TiN/MTCN/TiCN/$\kappa$-$Al_2O_3$/TiN from the substrate of the hard metal cutting tool.

13. The method of claim 10, wherein the $\kappa$-$Al_2O_3$ coating layer has a thickness of about 2 µm to 12 µm.

14. The method of claim 13, wherein at least 1 µm to 4 µm of the thickness of the $\kappa$-$Al_2O_3$ coating layer is transformed into an $\alpha$-$Al_2O_3$ coating layer through the electron beam irradiation.

15. The method of claim 10, wherein the electron beam is irradiated with a diameter of 50 mm to 100 mm and a power of 25KV to 45KV.

16. The method of claim 10, wherein the electron beam is irradiated repeatedly 1 to 10 times depending on a reaction state of the surface of the ceramic coating layer.

17. The method of claim 10, wherein the electron beam is irradiated from an electron beam generator at a vacuum atmosphere injected with a small quantity of argon or nitrogen gas.

18. A coated hard metal cutting tool comprising:
a substrate comprising a top rake surface;
at least one or more ceramic coating layers formed on the top rake surface;
a $\kappa\text{-}Al_2O_3$ coating layer formed on said one or more ceramic coating layers; and
an outermost $\alpha\text{-}Al_2O_3$ coating layer formed on said $\kappa\text{-}Al_2O_3$ coating layer, wherein:
the outermost $\alpha\text{-}Al_2O_3$ coating layer is formed by electron beam irradiation, on the entire top rake surface, of a portion of $\kappa\text{-}Al_2O_3$ originally belonging to said $\kappa\text{-}Al_2O_3$ coating layer, whereby said portion of $\kappa\text{-}Al_2O_3$ is transformed into $\alpha\text{-}Al_2O_3$;
the outermost $\alpha\text{-}Al_2O_3$ coating layer has a surface roughness under Ra 0.15 μm, and
the outermost $\alpha\text{-}Al_2O_3$ coating layer comprises a solidified layer following instantaneous melting by the electron beam irradiation.

19. The coated hard metal cutting tool of claim 18, wherein:
the outermost $\alpha\text{-}Al_2O_3$ coating layer has a surface roughness that is enhanced compared to that of the $\kappa\text{-}Al_2O_3$ coating layer prior to electron beam irradiation.

20. A method for treating an entire top rake surface of a hard metal cutting tool, comprising:
providing one or more ceramic coating layers on the top rake surface of the cutting tool, the one or more ceramic coating layers comprising a $\kappa\text{-}Al_2O_3$ coating layer;
after the one or more ceramic coating layers are provided on the top rake surface, irradiating an electron beam to the one or more ceramic coating layers, on the entire top rake surface, to transform at least a portion of the $\kappa\text{-}Al_2O_3$ coating layer to an $\alpha\text{-}Al_2O_3$ coating layer by instantaneously melting and solidifying the $\kappa\text{-}Al_2O_3$ coating layer to thereby form an outermost $\alpha\text{-}Al_2O_3$ coating layer; and
further irradiating an electron beam to the outermost $\alpha\text{-}Al_2O_3$ coating layer to enhance surface roughness of the outermost $\alpha\text{-}Al_2O_3$ coating layer by instantaneously melting and solidifying the outermost $\alpha\text{-}Al_2O_3$ coating layer.

* * * * *